(12) United States Patent
Meschkat et al.

(10) Patent No.: US 12,733,135 B2
(45) Date of Patent: Sep. 8, 2026

(54) DATA CENTER WITH A SWITCH CABINET ROW ARRANGED IN A CONTAINER AND A COLD AISLE-WARM AISLE PARTITION

(71) Applicant: RITTAL GMBH & CO. KG, Herborn (DE)

(72) Inventors: Jan Meschkat, Hüttenberg (DE); Peter Sturm, Leun (DE); Jan-Eric Schacht, Neunkirchen (DE)

(73) Assignee: RITTAL GMBH & CO. KG, Herborn (DE)

( * ) Notice: Subject to any disclaimer, the term of this patent is extended or adjusted under 35 U.S.C. 154(b) by 232 days.

(21) Appl. No.: 18/691,101

(22) PCT Filed: Oct. 12, 2022

(86) PCT No.: PCT/DE2022/100755
§ 371 (c)(1),
(2) Date: Mar. 12, 2024

(87) PCT Pub. No.: WO2023/061536
PCT Pub. Date: Apr. 20, 2023

(65) Prior Publication Data

US 2024/0381583 A1 Nov. 14, 2024

(30) Foreign Application Priority Data

Oct. 13, 2021 (DE) ..................... 10 2021 126 550.9

(51) Int. Cl.
*H05K 7/20* (2006.01)

(52) U.S. Cl.
CPC ..... *H05K 7/20745* (2013.01); *H05K 7/20145* (2013.01); *H05K 7/20754* (2013.01); *H05K 7/20836* (2013.01)

(58) Field of Classification Search
CPC ........... H05K 7/20745; H05K 7/20145; H05K 7/20754; H05K 7/20836
See application file for complete search history.

(56) References Cited

U.S. PATENT DOCUMENTS 6,643,123 B2 * 11/2003 Hartel .................... H02B 1/565 361/678
7,016,194 B1 * 3/2006 Wong ........................ G06F 1/20 361/679.02
8,331,086 B1 * 12/2012 Meissner ............. H05K 7/1497 361/679.5

(Continued)

FOREIGN PATENT DOCUMENTS

CN 105338793 A 2/2016
CN 111669953 A 9/2020

(Continued)

OTHER PUBLICATIONS

International Search Report (English and German) and Written Opinion of the ISA (German) issued in PCT/DE2022/100755, mailed Jan. 20, 2023; ISA/EP.

(Continued)

*Primary Examiner* — Michael A Matey
(74) *Attorney, Agent, or Firm* — Harness, Dickey & Pierce, P.L.C.

(57) ABSTRACT

A data center having a switch cabinet row which is arranged in a container and which separates a cold aisle from a hot aisle by means of a partition, wherein at least one cooling device is inserted into at least one aperture through an outer wall of the container, which is connected to the inside of the container by means of its inner air circuit and which is connected to the surroundings of the container by means of its outer air circuit which is fluidically closed off from the inner air circuit, and wherein the partition fluidically separates a cooling air outlet of the inner air circuit from a warm air inlet of the inner air circuit.

14 Claims, 2 Drawing Sheets

(56) References Cited

U.S. PATENT DOCUMENTS

Figure 1:
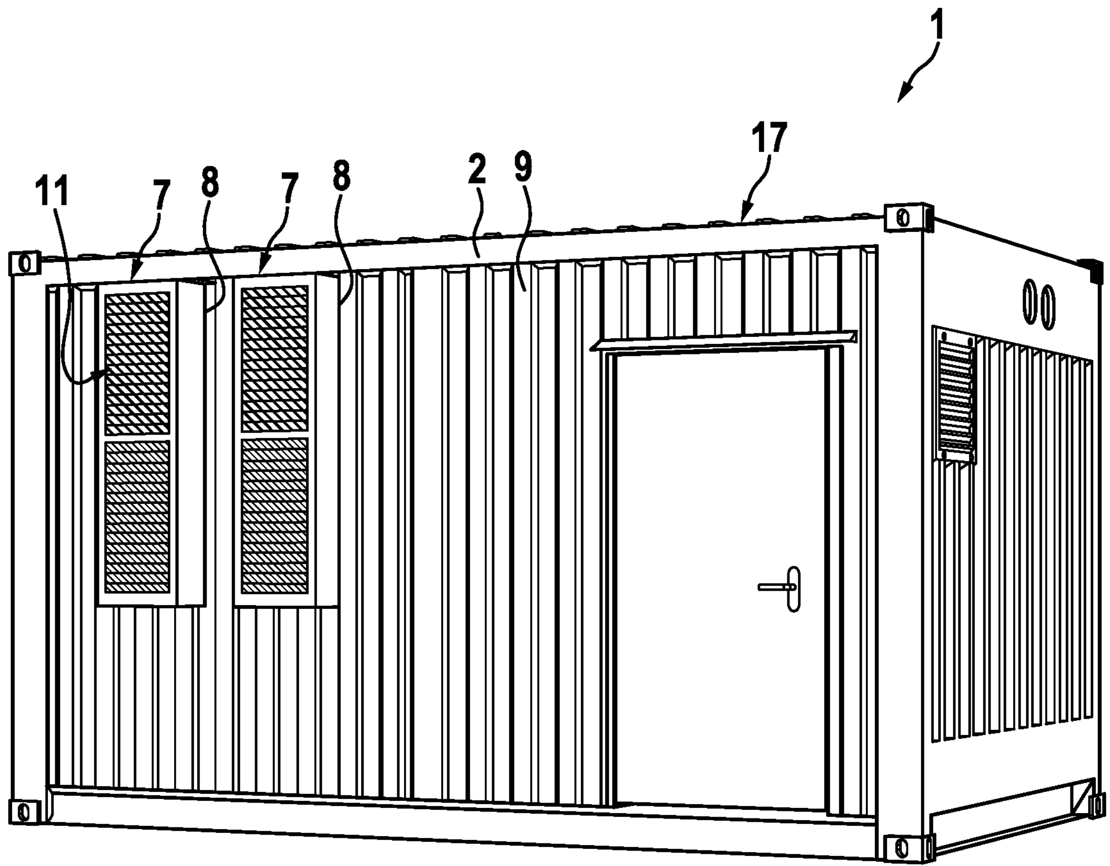

| | | | | |
|---|---|---|---|---|
| 8,961,278 | B2 * | 2/2015 | Coors | H05K 7/20745 454/49 |
| 10,271,462 | B1 * | 4/2019 | Ross | H05K 7/20827 |
| 10,925,185 | B1 * | 2/2021 | Bailey | H05K 7/20736 |
| 11,039,551 | B1 * | 6/2021 | Bailey | H05K 7/20145 |
| 2009/0107652 | A1 * | 4/2009 | VanGilder | G06F 1/20 165/80.2 |
| 2010/0012370 | A1 * | 1/2010 | Larsen | H02G 3/0443 174/481 |
| 2012/0205089 | A1 * | 8/2012 | Doerrich | H05K 7/20745 165/287 |
| 2013/0008197 | A1 * | 1/2013 | Lin | H05K 7/1497 62/132 |
| 2013/0042639 | A1 * | 2/2013 | Kobayashi | H05K 7/20836 62/89 |
| 2014/0075075 | A1 * | 3/2014 | Morrill | H04M 1/72412 710/303 |
| 2014/0273792 | A1 * | 9/2014 | Kondo | H05K 7/20836 454/184 |
| 2015/0096714 | A1 * | 4/2015 | Dagley | H05K 7/20836 165/8 |
| 2015/0156925 | A1 * | 6/2015 | Chang | H05K 7/20836 165/287 |
| 2015/0245541 | A1 * | 8/2015 | Endo | H05K 7/20745 700/282 |
| 2016/0037685 | A1 * | 2/2016 | Ross | H05K 7/2079 165/104.19 |
| 2022/0015269 | A1 * | 1/2022 | Xu | H05K 7/20836 |

FOREIGN PATENT DOCUMENTS

| | | | |
|---|---|---|---|
| EP | 2811366 | A1 | 12/2014 |
| EP | 2891396 | B1 | 10/2016 |
| EP | 3157316 | B1 | 7/2021 |
| KR | 10-2013-0041124 | A | 4/2013 |
| WO | 2014174606 | A1 | 10/2014 |
| WO | 2015186343 | A1 | 12/2015 |
| WO | 2020219082 | A1 | 10/2020 |

OTHER PUBLICATIONS

German International Preliminary Report on Patentability issued in PCT/DE2022/100755, dated Sep. 15, 2023.

* cited by examiner

DATA CENTER WITH A SWITCH CABINET ROW ARRANGED IN A CONTAINER AND A COLD AISLE-WARM AISLE PARTITION

CROSS-REFERENCE TO RELATED APPLICATIONS

This application is a U.S. National Phase Application under 35 U.S.C. 371 of International Application No. PCT/DE2022/100755, filed on Oct. 12, 2022, which claims the benefit of German Patent Application No. 10 2021 126 550.9, filed on Oct. 13, 2021. The entire disclosures of the above applications are incorporated herein by reference.

BACKGROUND

This section provides background information related to the present disclosure which is not necessarily prior art.

Technical Field

The invention is based on a data center with a switch cabinet row arranged in a container, which with a partition separates a cold aisle from a warm aisle. Such a data center is described in EP 3 157 316 B1. Similar data centers are also described in WO 2014/174606 A1, US 2013/0008197 A1, and US 2015/0245541 A1.

Discussion

The known data centers, which are based on a container, have the disadvantage that they only have a limited scalability of the provided cooling capacity. In particular, corresponding cooling devices are generally permanently installed in the container, so that for an increase of the cooling capacity, for example within the scope of an expansion of the IT infrastructure in the container, for example an inline cooling device in the switch cabinet row has to be exchanged for another cooling device with a correspondingly adapted cooling capacity. The cooling devices are further limited with regard to the related cooling technology or require a considerable piping in order to fluidically connect external free coolers or chillers with evaporators installed in the switch cabinet row or in the double bottom.

SUMMARY

This section provides a general summary of the disclosure and is not a comprehensive disclosure of its full scope or all of its features.

It is therefore one aspect of the invention to further develop a data center of the type described at the beginning such that it has a high scalability with regard to the related cooling technology and for this purpose in particular the exchange of the cooling technology, for example for capacity adaptation, is implemented with simple technical means.

Accordingly, it is provided in a data center that at least one cooling device is inserted in at least one opening through an outer wall of the container, which is connected with an inner air circuit to the inside of the container, and which is connected with its outer air circuit fluidically separated from the inner air circuit to the surroundings of the container. It is further provided that the partition fluidically separates a cooling air outlet of the inner air circuit from a warm air inlet of the inner air circuit.

The invention thus makes use of the circumstance that, due to the design, containers can be provided with openings in almost any manner, even subsequently, in order to insert cooling devices of any capacity easily exchangeable therein. The cooling devices can in turn be switch cabinet cooling devices known from the state of the art, which can be correspondingly mounted in or on an opening of a flat part of a switch cabinet housing, so that they are associated with their inner air circuit to the inside of the switch cabinet and with their outer air circuit to the surroundings of the switch cabinet housing. Depending on the design, different cooling technologies can be implemented in the cooling device, for example a free cooling, a refrigerating machine or a combination of both. A cooling device particularly suitable for the present invention is described for example in EP 2 891 396 B1.

The cooling device can particularly preferably be inserted in an opening through a vertical outer wall of the container. The cooling air outlet can be arranged below the warm air inlet, wherein the cooling air outlet is preferably arranged vertically below the warm air inlet. This arrangement of cooling air outlet and warm air inlet corresponds to the arrangement usual in switch cabinet cooling devices, which is set up to blow in cooling air in a lower region of the switch cabinet housing and to suck it back into the cooling device after heating and corresponding convection in an upper region of the switch cabinet housing. In one embodiment of the invention, this arrangement of warm air inlet and air outlet is used to correspondingly apply cooling air to the switch cabinet row in the cold aisle in a lower region and to suck heated air out of the warm aisle in an upper region partitioned off from it.

The inside of the container can be fluidically separated from the surroundings of the container, so that a mixing of the air received in the inside of the container and the ambient air is avoided. In contrast to the container solutions known from the state of the art, it is therefore also not necessary that a filtering of the air entering the inside of the switch cabinet takes place, since no ambient air possibly loaded with impurities is conveyed into the container.

The partition can be guided at least in sections horizontally and/or at an acute angle to the horizontal. The partition can be optically transparent at least in a section guided horizontally and/or at an acute angle to the horizontal. This is expedient in particular when a light source emitting downwards is arranged above the optically transparent section. The light source can be arranged in particular under the roof of the container, as is known in container data centers from the state of the art. In this respect, the partition according to the invention of the data center in no way influences the usual lighting infrastructure of the container data center.

The warm aisle can extend above the switch cabinet row over the entire width of the inside of the container over the switch cabinet row. In particular, it can thus be provided that the partition does not adjoin the roof of the container at any point. Rather, the partition can be guided between an upper side of the switch cabinet row and that outer wall, preferably a vertical side wall, of the container, in which the at least one opening is formed, in which the at least one cooling device is inserted, wherein the partition at its transition to the outer wall fluidically separates the warm air inlet facing the warm aisle from the cooling air outlet facing the cold aisle in the manner according to the invention.

The warm aisle can accordingly extend between opposite vertical outer walls of the container, wherein one of the outer walls is the outer wall with the at least one opening. In particular, the warm aisle can extend at least in sections continuously between opposite vertical outer walls of the container.

The cooling air outlet can be arranged below a section of the partition extending horizontally or at an acute angle to the horizontal.

The cooling air outlet can be arranged opposite a cooling air inlet of the switch cabinet row. In this case, a warm air outlet of the switch cabinet row is preferably arranged on a side of the switch cabinet row arranged opposite the cooling air inlet of the switch cabinet row.

In the warm aisle, a horizontal air guide with at least one air guide channel can be arranged above the switch cabinet row, preferably between the switch cabinet row and the roof of the container, wherein the at least one air guide channel preferably opens into the warm air inlet of the inner air circuit of the cooling device.

The cooling device can have an open-air cooling system, which preferably has a heat pipe or a heat pipe. In addition, the cooling device can have a refrigerating machine, wherein the open-air cooling system and the refrigerating machine have refrigerant circuits separated from one another. In particular, the two refrigerant circuits separated from one another can be operated independently of one another, for example depending on the temperature difference between an actual temperature in the inside of the switch cabinet and an ambient temperature of the container and/or depending on a cooling capacity to be provided.

The two refrigerant circuits can be controlled with prioritization of the open-air cooling system and depending on a power loss of the switch cabinet row and an ambient air temperature of the container, in order to provide a required cooling capacity.

With the aid of the data center of the type described above, an all-in-one container solution for outdoor use can be provided, in which a very high energy and cost efficiency for the operation of the data center can be provided on account of the very good availability of any desired switch cabinet cooling devices. On account of the good scalability, regions with an IT load of 10 to 70 KW can be optimally covered. In particular, in comparison with the data centers known from the state of the art, split devices, which have a complex piping and can only be adapted to changing cooling requirements to a limited extent, can be avoided.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations and are not intended to limit the scope of the present disclosure.

Figure 2:
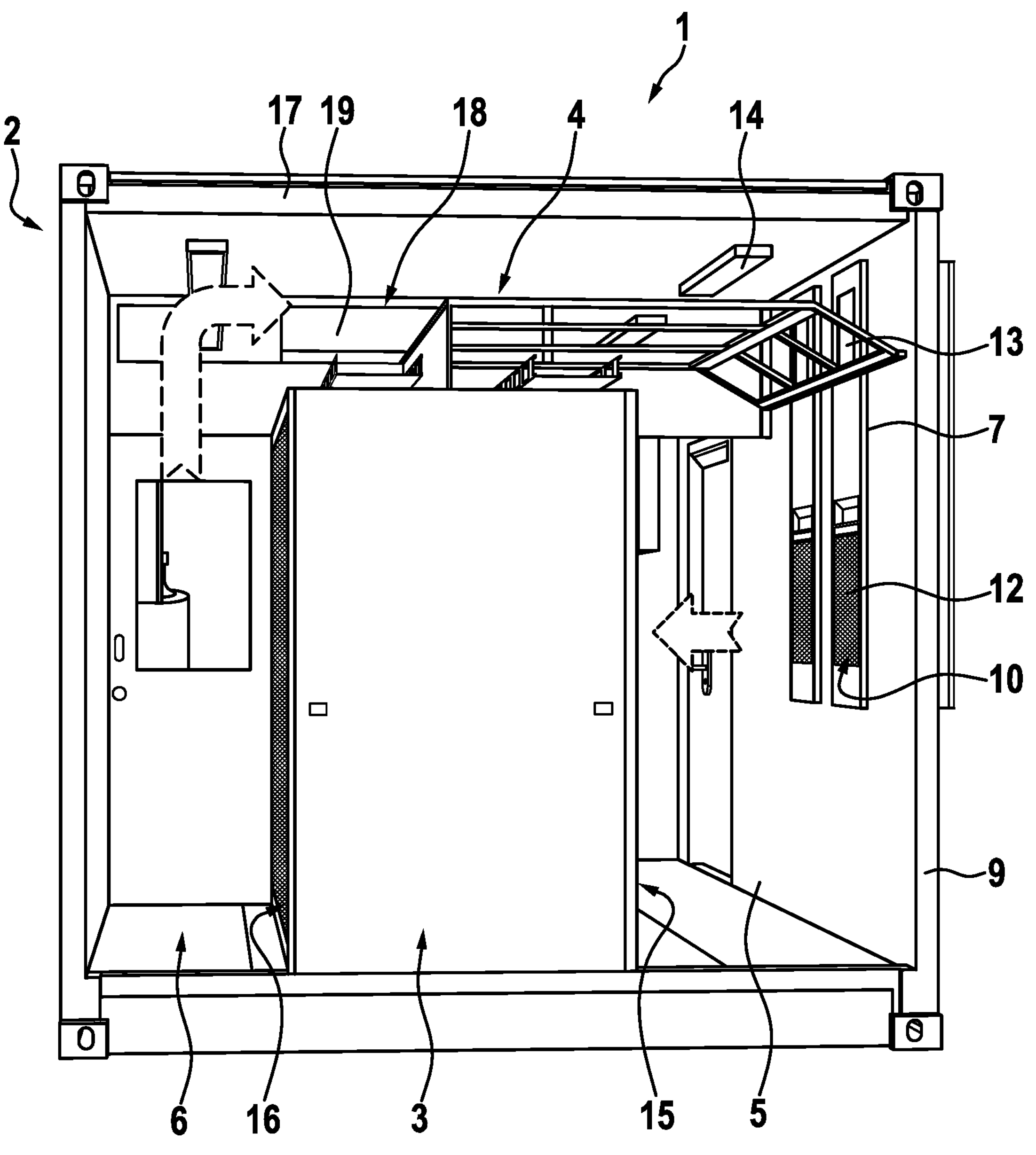

Further details of the invention are explained with reference to the following figures. In the figures:

FIG. 1 shows a perspective illustration of an external view of a data center according to the invention; and FIG. 2 shows a cross-sectional view of the data center according to FIG. 1.

DETAILED DESCRIPTION

Example embodiments will now be described more fully with reference to the accompanying drawings.

FIGS. 1 and 2 show an exemplary embodiment of a data center 1 according to the invention, which is based on a container 2. In the present case, two cooling devices 7 are inserted into a vertical outer wall 9, for which purpose the outer wall 9 has two openings 8, through each of which a cooling device 7 extends, so that they are fluidically connected with their inner air circuit 10 to the inside of the container 2, while their outer air circuit 11 is open to the surroundings of the container 2. The cooling device 7 can be, for example, a cooling device, as is described in EP 2 891 396 B1, with an outer air circuit fluidically separated from the inner air circuit and based on a hybrid cooling technology, consisting of a refrigerating machine and a heat pipe, which have refrigerant circuits separated from one another and can be controlled independently of one another, in order to compensate for a required cooling capacity, for example for compensating for a currently present power loss of an IT infrastructure received in the switch cabinet row 3, depending on the situation and for example according to energy efficiency considerations.

FIG. 1 further illustrates that the number of cooling devices 7 can basically be scaled as desired by additional openings 8 being introduced into the outer wall 9 as required. Since the cooling devices 7 can be commercially available switch cabinet cooling devices, they can also be exchanged individually and as required, so that a highly flexible adaptation of the cooling technology and the cooling capacity and efficiency of the cooling devices can be achieved.

FIG. 2 illustrates that a switch cabinet row 3 is received in the inside of the container 2 in the manner known per se, which switch cabinet row separates a cold aisle 5 from a warm aisle 6, wherein, in contrast to the solutions known from the state of the art, a partition 4 is guided precisely not between the upper side of the switch cabinet row 3 and the roof 17 of the container 2, but starting from the upper side of the switch cabinet row 3 to the outer wall 9 of the container 2, in which the two cooling devices 7 are inserted.

The partition 4 in this case adjoins the outer wall 9 precisely such that a cooling air outlet 12 of the inner air circuit 10 is fluidically separated from a warm air inlet 13 of the inner air circuit 10. For this purpose, it can be provided in particular that the partition 4 according to the invention also extends over the entire length (perpendicular to the drawing plane of FIG. 2) of the switch cabinet row 3 in the manner known in principle from the state of the art, the cooling air emerging from the inner circuit 10 via the cooling air outlet 12 of the cooling device 7 is blown directly in front of a cooling air inlet 15 of the switch cabinet row 3. On account of the overpressure generated in the cold aisle, the cooling air is pushed through the switch cabinet row 3, heated in the process and blown out into the warm aisle 6 as heated air. In contrast to the data centers known from the state of the art, the warm air can now reach the outer wall 9 having the cooling device 7 over the entire width of the container, that is to say also over the cold aisle 5, in order to be sucked into the cooling device 7 from there via the warm air inlet 13 of the inner air circuit 10. After the warm air has been cooled in the cooling device 7, it can be blown out into the cold aisle 5 again as cooled air in the manner described above and can again apply pressure to the switch cabinet row 3.

The partition 4 is guided at least in sections horizontally or at an acute angle to the roof 17 or to the horizontal. The partition 4 can be formed optically transparent at least in the horizontal section and/or in a section guided at an acute angle to the horizontal or to the roof 17, so that it is translucent. This makes it possible that the partition 4 itself does not have to have any light sources, but rather the standard light sources 14 provided in containers for data centers on the roof 17 can be used, so that in this respect no adaptations of the lighting technology are required for using the partition according to the invention.

In order to optimise the air guide above the switch cabinet row 3, a horizontal air guide 18 with an air guide channel 19 is provided between the switch cabinet row 3 and the roof 17 of the container 2. It can be provided that the air guide channel opens into the warm air inlet of the inner air circuit of the cooling device, in order to optimise the air guide from the side of the switch cabinet row 3 having the warm air outlet 16 of the switch cabinet row 3 over the switch cabinet row 3 to the warm air inlet 13 of the cooling device 7 in the outer wall 9 of the container 2 delimiting the cold aisle 5.

The features of the invention disclosed in the above description, in the drawings and in the claims can be essential both individually and in any combination for implementing the invention.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A data center comprising a switch cabinet row which is arranged in a container and which separates a cold aisle from a hot aisle by a partition, wherein at least one cooling device is inserted into at least one aperture and extends through a vertical outer wall of the container, which is connected to the inside of the container by an inner air circuit and which is connected to the surroundings of the container by an outer air circuit which is fluidically closed off from the inner air circuit, and wherein the partition fluidically separates a cooling air outlet of the inner air circuit from a warm air inlet of the inner air circuit.

2. The data center according to claim 1, in which the cooling air outlet is arranged below the warm air inlet, preferably vertically below the warm air inlet.

3. The data center according to claim 1, in which the inside of the container is fluidically separated from the surroundings of the container, so that mixing of the air received in the inside of the container and the ambient air is avoided.

4. The data center according to claim 1, in which the partition is guided at least in sections horizontally and/or at an acute angle to the horizontal.

5. The data center according to claim 1, in which the partition is optically transparent at least in a section guided horizontally and/or at an acute angle to the horizontal.

6. The data center according to claim 5, wherein a light source radiating vertically downwards is arranged above the optically transparent section.

7. The data center according to claim 1, in which the hot aisle extends above the switch cabinet row over the entire width of the inside of the container and over the switch cabinet row.

8. The data center according to claim 1, in which the hot aisle extends between opposite vertical outer walls of the container, wherein one of the outer walls is the outer wall having the at least one aperture.

9. The data center according to claim 1, in which the cooling air outlet is arranged below a section of the partition extending horizontally or at an acute angle to the horizontal.

10. The data center according to claim 1, in which the cooling air outlet is arranged opposite a cooling air inlet of the switch cabinet row, wherein a warm air outlet of the switch cabinet row is arranged on a side of the switch cabinet row arranged opposite the cooling air inlet of the switch cabinet row.

11. The data center according to claim 1, in which a horizontal air guide having at least one air guide channel is arranged in the hot aisle above the switch cabinet row, preferably between the switch cabinet row and the roof of the container, wherein the air guide channel preferably opens into the warm air inlet of the inner air circuit of the cooling device.

12. The data center according to claim 1, in which the cooling device has a free cooling, which preferably has a heat pipe.

13. The data center according to claim 12, in which the cooling device has a refrigerating machine in addition to the free cooling, wherein the free cooling and the refrigerating machine have refrigerant circuits separate from one another.

14. The data center according to claim 13, in which the two refrigerant circuits are controlled to provide a required cooling power by prioritizing the free cooling and depending on a power loss of the switch cabinet row and an ambient air temperature of the container.

* * * * *